United States Patent
Mao et al.

(10) Patent No.: US 11,443,658 B2
(45) Date of Patent: Sep. 13, 2022

(54) FLEXIBLE DISPLAY PANELS, MANUFACTURING METHODS THEREOF AND FLEXIBLE DISPLAY APPARATUSES

(71) Applicant: KunShan Go-Visionox Opto-Electronics Co., Ltd, Jiangsu (CN)

(72) Inventors: Zupan Mao, Kunshan (CN); Yangjie Zhu, Kunshan (CN); Bo Wei, Kunshan (CN); Haifeng Lu, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 181 days.

(21) Appl. No.: 16/997,175

(22) Filed: Aug. 19, 2020

(65) Prior Publication Data

US 2020/0380894 A1 Dec. 3, 2020

Related U.S. Application Data

(63) Continuation of application No. PCT/CN2019/088647, filed on May 27, 2019.

(30) Foreign Application Priority Data

Nov. 29, 2018 (CN) .......................... 201811442702.X (51) Int. Cl.
*G09F 9/30* (2006.01)
*H01L 51/00* (2006.01)
(Continued)

(52) U.S. Cl.
CPC .......... *G09F 9/301* (2013.01); *H01L 51/0097* (2013.01); *H01L 51/5253* (2013.01);
(Continued)

(58) Field of Classification Search
None
See application file for complete search history.

(56) References Cited

U.S. PATENT DOCUMENTS

| 9,229,566 B2 | 1/2016 | Kang | |
|---|---|---|---|
| 2017/0194404 A1* | 7/2017 | Park | H01L 27/3272 |
| 2018/0033821 A1* | 2/2018 | Kim | H01L 27/124 |

FOREIGN PATENT DOCUMENTS

| CN | 105074802 A | 11/2015 |
|---|---|---|
| CN | 105826350 A | 8/2016 |

(Continued)

OTHER PUBLICATIONS

International Search Report dated Sep. 4, 2019 in corresponding International application No. PCT/CN2019/088647; 4 pages.

*Primary Examiner* — J. E. Schoenholtz
(74) *Attorney, Agent, or Firm* — Maier & Maier, PLLC (57) ABSTRACT

Included are flexible display panels, manufacturing methods thereof and flexible display apparatuses, which are used to solve the problem of poor conductive function of wires in a bending area. The flexible display panel includes a display area and a bending area located around the display area, where the bending area includes: a flexible substrate; an adjustment layer covering the entire flexible substrate; a protective layer located on the adjustment layer; a plurality of wires located on the protective layer; and a planarization layer located above the wires and covering a functional film layer on the flexible substrate; where the protective layer corresponds to the wires in the bending area, and an orthographic projection of the wires in the bending area on the flexible substrate falls into an orthographic projection of the protective layer on the flexible substrate.

20 Claims, 5 Drawing Sheets

(51) Int. Cl.
*H01L 51/52* (2006.01)
*H01L 51/56* (2006.01)
(52) U.S. Cl.
CPC ........ *H01L 51/56* (2013.01); *H01L 2251/303* (2013.01); *H01L 2251/5338* (2013.01)

(56) References Cited

FOREIGN PATENT DOCUMENTS

| | | | |
|---|---|---|---|
| CN | 205427390 U | 8/2016 | |
| CN | 106935628 A | 7/2017 | |
| CN | 107004767 A | 8/2017 | |
| CN | 107170758 A | 9/2017 | |
| CN | 107578707 A | 1/2018 | |
| CN | 107978611 A | 5/2018 | |
| CN | 107994036 A | 5/2018 | |
| CN | 108010922 A | 5/2018 | |
| CN | 108154801 A | 6/2018 | |
| CN | 108198827 A | 6/2018 | |
| CN | 108320668 A | 7/2018 | |
| CN | 108389866 A | 8/2018 | |
| CN | 109560110 A | 4/2019 | |
| EP | 3188269 A1 * | 7/2017 | ......... H01L 27/3244 |

* cited by examiner

FIG. 7

FLEXIBLE DISPLAY PANELS, MANUFACTURING METHODS THEREOF AND FLEXIBLE DISPLAY APPARATUSES

CROSS-REFERENCE TO RELATED APPLICATIONS

This application is a continuation of International Application No. PCT/CN2019/088647, filed on May 27, 2019, which claims priority to Chinese Patent Application No. 201811442702X, entitled "Flexible display panels, manufacturing methods thereof, and flexible display apparatuses" and filed on Nov. 29, 2018, which are hereby incorporated by reference in their entireties.

FIELD

The present disclosure relates to the field of display technology, and particularly, to flexible display panels, manufacturing methods thereof and flexible display apparatuses.

BACKGROUND

A display apparatus is an apparatus for displaying a screen of characters, numbers, symbols and pictures, or an image formed by the combination of at least two of characters, numbers, symbols and pictures. The display apparatus may be a flat display apparatus, a curved display apparatus, a 3D display apparatus, a near-eye display apparatus, an AR/VR display apparatus, etc.

At present, with the rapid development of technology, flexible display apparatuses have gradually entered people's field of vision and are sought after by people. For example, there is a flexible display apparatus in the prior art, including a flexible display panel, where the flexible display panel includes a display area and a non-display area located around the display area. And in order to increase the screen-to-body ratio of the flexible display apparatus, certain non-display areas will be used as the bending area, and the bending area will be bent to the back of the flexible display panel, such as the area where a driver chip is located. In the bending area, there may be a lot of wires configured to transmit signals for achieving display function, touch function and other functions of the flexible display apparatus.

In the existing flexible display panel, when the bending area is bent, the wires in the bending area will also be bent, and thus the wires are easy to crack or even break, resulting in poor electrical conductivity.

SUMMARY

In view of the above problems, the embodiments of the present disclosure provide flexible display panels, manufacturing methods thereof and flexible display apparatuses, so as to solve the technical problem that the wires in the bending area are likely to crack or even break when the bending area in the flexible display panel is bent and thus the conductive function of the wires is adversely affected.

In order to achieve the above objective, the embodiments of the present disclosure provide the following technical solutions:

A first aspect of embodiments of the present disclosure provides a flexible display panel, including a display area and a bending area located around the display area, where the bending area includes: a flexible substrate; an adjustment layer, covering the entire flexible substrate; a protective layer, located on the adjustment layer; a plurality of wires, located on the protective layer; and a planarization layer, located above the wires and covering a functional film layer on the flexible substrate; where the protective layer corresponds to the wires in the bending area, and an orthographic projection of the wires in the bending area on the flexible substrate falls into an orthographic projection of the protective layer on the flexible substrate; when the bending area is bent, a bending stress is released through an interface between the adjustment layer and the protective layer, so as to relieve the stress that the protective layer bears when the bending area is bent.

In the bending area of the flexible display panel provided by the embodiment of the present disclosure, an adjustment layer is provided on the flexible substrate, and a protective layer is provided under the wires. An interface is formed between the protective layer and the adjustment layer, where the bending stress can be released through the interface to relieve the stress that the protective layer bears when the bending area is bent, thereby reducing the occurrence of cracks or even breaks in the wires in the bending area to prevent the conductive function of the wires from being adversely affected; at the same time, since the interface between the protective layer and the adjustment layer is formed, the bending stress can be released through the interface when the bending area is bent, and thus the adjustment layer and the protective layer can be provided with a smaller thickness within the range that can be achieved by the process. Therefore, when the bending area is being bent, stress concentration is not easily formed and the stress in the adjustment layer and the protective layer is easier to be released, which can reduce the occurrence of cracks or even breaks in the wires in the bending area to prevent the conductive function of the wires from being adversely affected. Moreover, in the flexible display panel provided by the embodiment of the present disclosure, the protective layer corresponds to the wires in the bending area, and an orthographic projection of the wires on the flexible substrate in the bending area falls into an orthographic projection of the protective layer on the flexible substrate. Compared with the usually used structure with a large coverage area of the functional film layer under the wires, when the bending area is being bent, stress concentration is not easily formed in the protective layer, and the stress in the protective layer is easily released, thereby further reducing the occurrence of cracks or even breaks in the wires to prevent the conductive function of the wires from being adversely affected.

In an embodiment of the present disclosure, an orthographic projection of the protective layer on the flexible substrate coincides with an orthographic projection of the wires in the bending area on the flexible substrate, and thus the coverage area of the protective layer under the wires is reduced. And when the bending area is being bent, stress concentration is not easily formed in the protective layer, and the stress in the protective layer is easily released, thereby further reducing the occurrence of cracks or even breaks in the wires to prevent the conductive function of the wires from being adversely affected.

In an embodiment of the present disclosure, there is no integral protective layer between adjacent wires in the bending area, thereby preventing stress from being conducted to each other, and thus further reducing the occurrence of cracks or even breaks in the wires to prevent the conductive function of the wires from being adversely affected.

In an embodiment of the present disclosure, a passivation layer is further provided between the wires and the planarization layer. When the bending area is bent, the stress that the passivation layer bears is equal to the stress that the protective layer bears. When the bending area is being bent, the passivation layer and the protective layer cooperate with each other to release the stress, and the stress that the passivation layer bears is equal to the stress that the protective layer bears at the same time. The wires are pulled by the passivation layer and the protective layer, and the upper and lower sides of the wires are evenly stressed, thereby further reducing the occurrence of cracks or even breaks in the wires to prevent the conductive function of the wires from being adversely affected.

In an embodiment of the present disclosure, the passivation layer covers the wires in the bending area and the adjustment layer. That is, after completing the deposition of the passivation film, the passivation film is directly used as the passivation layer, without further etching or other processes. In this way, the process steps of manufacturing the flexible display panel can be reduced, thereby increasing efficiency and lowering the cost.

In an embodiment of the present disclosure, the passivation layer is located on the wires in the bending area and corresponds to the wires in the bending area. That is, after completing the deposition of the passivation film, the passivation film is etched to form a passivation layer located on the wires in the bending area and corresponding to the wires in the bending area. And an orthographic projection of the passivation layer on the flexible substrate coincides with an orthographic projection of the wires in the bending area on the flexible substrate. In this way, the passivation layer does not cover sides of the wires in the bending area, and thus the probability of stress being transmitted from sides of the wires in the bending area to the wires in the bending area can be reduced and the probability of stress conduction between adjacent wires in the bending area can be reduced, thereby reducing the occurrence of cracks or even breaks in the wires to prevent the conductive function of the wires from being adversely affected.

In an embodiment of the present disclosure, the passivation layer is selected from the group consisting of a silicon oxide passivation layer, a silicon nitride passivation layer, a silicon oxynitride passivation layer and an organic material passivation layer.

In an embodiment of the present disclosure, the adjustment layer is an a-Si (amorphous silicon) layer. By selecting a-Si as the material of the adjustment layer, when the thin film transistor in the display area is a low temperature polysilicon thin film transistor, the adjustment layer and the active layer of the low temperature polysilicon thin film transistor can share a film layer structure, without the need to form an additional adjustment layer, thereby reducing the process steps of manufacturing a flexible display panel, increasing efficiency and lowering the cost. In addition, when forming the active layer, it is sufficient to directly perform doping on a-Si without etching, and thus the process steps of manufacturing the flexible display panel can be further reduced, thereby increasing efficiency and lowering the cost.

In an embodiment of the present disclosure, the thickness of the adjustment layer is less than or equal to 1000 Å, preferably less than or equal to 500 Å, so that the stress in the bending area is not easily concentrated.

In an embodiment of the present disclosure, the protective layer is a silicon oxide protective layer configured to prevent the hydrogen bond in the material of the protective film from adversely affecting the thin film transistor in the display area when depositing the protective film.

In an embodiment of the present disclosure, the thickness of the protective layer is less than or equal to 1000 Å, preferably 500 Å~1000 Å. If the thickness of the protective layer is thicker, stress concentration may easily occur in the protective layer.

A second aspect of embodiments of the present disclosure provides a flexible display apparatus including the flexible display panel as described in the above technical solutions.

The flexible display apparatus has the same advantages as the above-mentioned flexible display panel over the prior art, and they will not be repeated herein.

A third aspect of embodiments of the present disclosure provides a method for manufacturing a flexible display panel, which includes: forming a flexible substrate; forming an adjustment layer on the flexible substrate, where the adjustment layer covers the entire flexible substrate; forming a protective layer on the adjustment layer; forming wires on the protective layer; and forming a planarization layer above the wires, where the planarization layer is located above wires in a bending area and covers a functional film layer on the flexible substrate; where the protective layer corresponds to the wires in the bending area of the flexible display panel, and an orthographic projection of the wires in the bending area on the flexible substrate falls into an orthographic projection of the protective layer on the flexible substrate.

The method for manufacturing a flexible display panel has the same advantages as the above-mentioned flexible display panel over the prior art, and they will not be repeated herein.

In an embodiment of the present disclosure, after forming the wires on the protective layer and before forming the planarization layer, the method for manufacturing the flexible display panel further includes: forming a passivation layer. When the bending area is being bent, the passivation layer and the protective layer cooperate with each other to release the stress. At the same time, when the bending area is being bent, the stress that the passivation layer bears is equal to the stress that the protective layer bears. The wires are pulled by the passivation layer and the protective layer, and the upper and lower sides of the wires are evenly stressed, thereby further reducing the occurrence of cracks or even breaks in the wires to prevent the conductive function of the wires from being adversely affected.

In an embodiment of the present disclosure, the steps of forming the protective layer, the wires and the passivation layer includes: forming a protective film; etching the protective film to form the protective layer corresponding to the wires in the bending area; preferably, the orthographic projection of the wires in the bending area on the flexible substrate coincides with the orthographic projection of the protective layer on the flexible substrate; forming the wires on the protective layer; and forming the passivation layer, where the passivation layer covers the wires in the bending area and the adjustment layer; or the steps of forming the protective layer, the wires and the passivation layer includes: forming a protective film; forming the wires on the protective film; forming a passivation film, where the passivation film covers the wires in the bending area and the protective film; and etching the passivation film and the protective film to form the protective layer corresponding to the wires in the bending area and the passivation layer corresponding to the wires in the bending area; preferably, the orthographic projections of the wires in the bending area, the protective layer and the passivation layer on the flexible substrate coincide with each other.

In addition, all the contents of the structure, functions and the like described for the flexible display panel in the first aspect of the present disclosure are also applicable to the method for manufacturing a flexible display panel in the third aspect of the present disclosure, and they will not be repeated herein.

In addition to the technical problems solved by the embodiments of the present disclosure described above, the technical features constituting the technical solutions, and the beneficial effects brought by the technical features of the technical solutions, the flexible display panel and the manufacturing method thereof provided by the embodiments of the present disclosure, other technical problems that can be solved by the flexible display apparatus, other technical features included in the technical solution, and beneficial effects brought by these technical features will be further detailed in the description of embodiments.

BRIEF DESCRIPTION OF DRAWINGS

In order to illustrate the technical solutions of the embodiments of the present disclosure more explicitly, the following will briefly introduce the drawings required in the description of the embodiments. Obviously, the drawings in the following description are some embodiments of the present disclosure. Those of skilled in the art can obtain other drawings based on these drawings without creative works.

DETAILED DESCRIPTION

In order to make the above objects, features and advantages of the embodiments of the present disclosure more obvious and understandable, the technical solutions in the embodiments of the present disclosure will be described explicitly and completely in conjunction with the drawings in the embodiments of the present disclosure. Obviously, the described embodiments are only a part of the embodiments of the present disclosure, but not all the embodiments. Based on the embodiments in the present disclosure, all other embodiments obtained by the skilled in the art without paying creative efforts fall within the protection scope of the present disclosure.

The flexible display panel in the prior art has the problem that it is easy for the conductive function of the wires to be adversely affected, mainly because the wires are easy to crack, and the cause of cracks in the wires mainly includes: on the one hand, when the bending area of the flexible display panel is being bent, the bending method is not uniform and irregular, e.g., if the bending radius is too small, stress concentration will occur in the bending area, and there will be a large amount of stress in the bending area and the stress bearing area is small, resulting in cracks or even breaks in the bending area so that the conductive function of the wires is adversely affected; on the other hand, there are structural limitations of the functional film layer around the wires, especially above or below the wires, and the stress mismatches between the functional film layers, when the bending area is being bent, the stress in the functional film layer in the bending area is difficult to be released, which causes the wires in the bending area to be easily cracked or even broken, thereby causing the conductive function of the wires to be adversely affected.

Regarding the first aspect above, although it is caused by the inconsistency and irregularity of the method of bending the bending area, the root cause is still the structural limitation of the functional film in the bending area and the mismatch of the stress between the functional films. As a result, the stress concentrated in the bending area is difficult to be released, and the wires in the bending area are easy to crack or even break, leading to the adverse effect on the conductive function of the wires.

Therefore, no matter which of the above-mentioned causes, the cause of the adverse effect on the conductive function of the wires is essentially the structural limitation of the functional film layer in the bending area and the stress mismatches between the functional film layers. As a result, the stress concentrated in the bending area is difficult to be released, and the wires in the bending area are easy to crack or even break, leading to the adverse effect on the conductive function of the wires.

Figure 1:
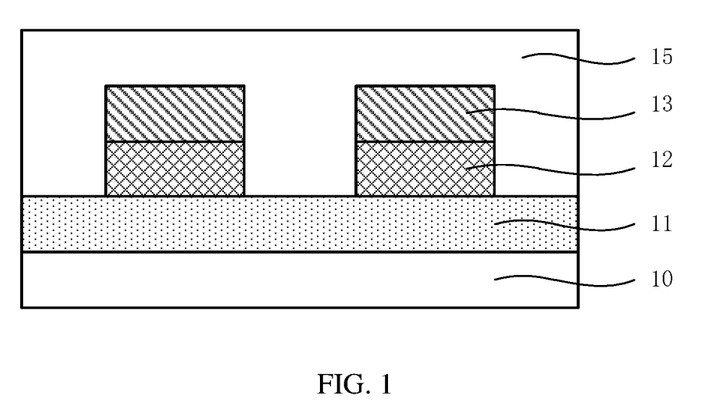
FIG. 1 is a schematic structural diagram of a flexible display panel provided by an embodiment of the present disclosure.
Figure 2:
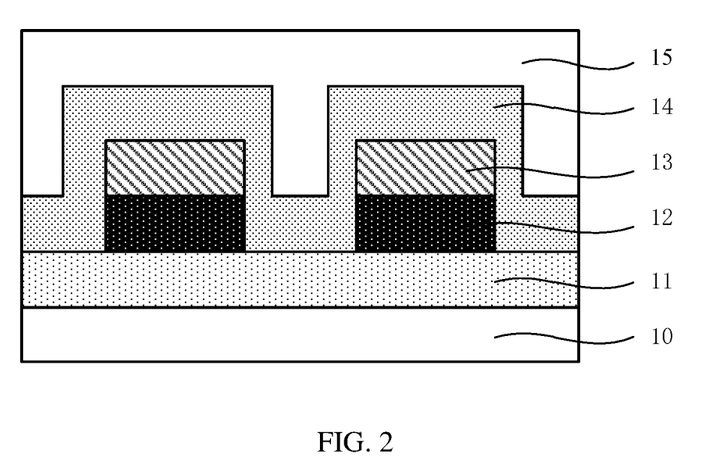
FIG. 2 is a schematic structural diagram of flexible display panel provided by an embodiment of the present disclosure, in which an exemplary passivation layer covering wires and adjustment layer is further included on the basis of the flexible display panel shown in FIG. 1.
Figure 3:
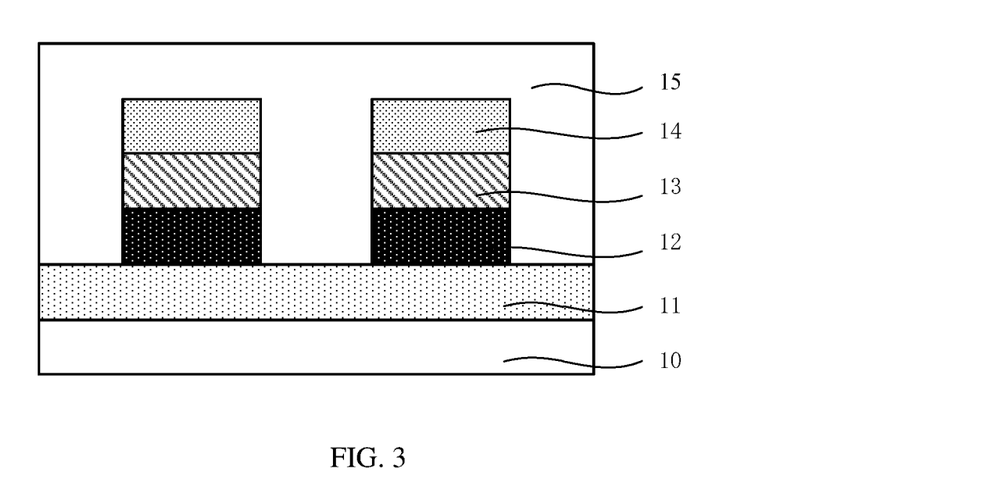
FIG. 3 is a schematic structural diagram of yet another flexible display panel provided by an embodiment of the present disclosure in which another exemplary passivation layer is further included on the basis of the flexible display panel shown in FIG. 1.

Please refer to FIG. 1, FIG. 2 or FIG. 3, an embodiment of the present disclosure provides a flexible display panel including a flexible substrate 10, an adjustment layer 11, a protective layer 12, wires 13 and a planarization layer 15, the flexible substrate 10 carries all functional layers in the flexible display panel. The functional layers include, for example, an adjustment layer 11, a protective layer 12 and wires 13; and it may also include a passivation layer to provide a guarantee for the bendability of the flexible display panel. The flexible substrate 10 may be a single-layer structure and, in this case, the flexible substrate 10 may be made from polyimide (PI). The flexible substrate 10 may also be a multilayer structure and, in this case, at least one layer of the flexible substrate 10 may be made from polyimide (PI).

The adjustment layer 11 is located on the flexible substrate 10, and the adjustment layer 11 covers the entire flexible substrate 10. The protective layer 12 is located on the adjustment layer 11, and the protective layer 12 corresponds to the wires 13 in the bending area of the flexible display panel. Specifically, an orthographic projection of the wires 13 in the bending area on the flexible substrate 10 falls into an orthographic projection of the protective layer 12 on the flexible substrate 10. Preferably, an orthographic projection of the protective layer 12 on the flexible substrate 10 coincides with an orthographic projection of the wires 13 on the flexible substrate 10. An interface is formed between the protective layer 12 and the adjustment layer 11, and when the bending area is bent, the bending stress can be released through the interface to relieve the stress that the protective layer 12 bears when the bending area is bent. The wires 13 are located on the protective layer 12, where the wires 13 are configured to transmit signals for the flexible display panel to achieve display function, touch function and other functions of the flexible display apparatus. The wires 13 may be metal wires 13, that is, the wires 13 are made of metal. For example, they may be made of metal element or alloy. The wires 13 may be a single-layer structure or a multilayer structure. Preferably, the wires 13 is a multilayer structure, and the wires 13 include at least three layers, and the two outer layers play a role of protecting the intermediate layer. For example, the wires 13 may have a three-layer structure, and in this case, the wires 13 may adopt a sandwich structure, such as Ti/Al/Ti, Mo/Al/Mo structure, and the like. The planarization layer 15 is located on the wires 13 and the planarization layer 15 covers the functional film layer on the flexible substrate 10 to protect the functional film layer on the flexible substrate 10 and facilitate the formation of subsequent film layers simultaneously and for example, to facilitate the formation of an OLED (Organic Light-Emitting Diode) device. The planarization layer 15 may be an organic material planarization layer or an inorganic material planarization layer.

In the bending area of the flexible display panel provided by the embodiment of the present disclosure, an adjustment layer 11 is provided on the flexible substrate 10, and a protective layer 12 is provided under the wires 13. An interface is formed between the protective layer 12 and the adjustment layer 11, where the bending stress can be released through the interface to relieve the stress that the protective layer 12 bears when the bending area is bent, thereby reducing the occurrence of cracks or even breaks in the wires in the bending area to prevent the conductive function of the wires 13 from being adversely affected; at the same time, because an interface between the protective layer 12 and the adjustment layer 11 is formed, the bending stress can be released through the interface when the bending area is bent, the adjustment layer 11 and the protective layer 12 can be provided with a smaller thickness, preferably less than or equal to 1000 Å. When the bending area is being bent, stress concentration is not easily formed and the stress in the adjustment layer 11 and the protection layer 12 is easier to be released, which can reduce the occurrence of cracks or even breaks in the wires 13 to prevent the conductive function of the wires 13 from being adversely affected. Moreover, in the flexible display panel provided by the embodiment of the present disclosure, the protective layer 12 corresponds to the wires 13 in the bending area, and an orthographic projection of the wires 13 on the flexible substrate 10 in the bending area falls into an orthographic projection of the protective layer 12 on the flexible substrate 10, preferably the two orthographic projections coincide with each other. Compared with the usually used structure with a large coverage area of the functional film layer under the wires 13, when the bending area is being bent, stress concentration is not easily formed in the protective layer 12, and the stress in the protective layer 12 is easily released, further reducing the occurrence of cracks or even breaks in the wires 13 to prevent the conductive function of the wires 13 from being adversely affected.

In addition, in the flexible display panel provided by the embodiment of the present disclosure, the protective layer 12 corresponds to the wires 13 in the bending area, and it could be understood that an orthographic projection of the wires 13 on the flexible substrate 10 falls into an orthographic projection of the protective layer 12 on the flexible substrate 10. Preferably, an orthographic projection of the wires 13 on the flexible substrate 10 coincides with an orthographic projection of the protective layer 12 on the flexible substrate 10. There is no integral protective layer 12 between adjacent wires 13 in the bending area, thereby preventing stress from being conducted to each other, and further reducing the occurrence of cracks or even breaks in the wires 13 to prevent the conductive function of the wires 13 from being adversely affected.

Furthermore, in the flexible display panel provided by the embodiment of the present disclosure, an adjustment layer 11 is provided on the flexible substrate 10, and the adjustment layer 11 covers the entire flexible substrate 10. In other words, the upper surface of the flexible substrate 10 in FIG. 1, FIG. 2 or FIG. 3 is completely covered by the adjustment layer 11 and will not be exposed. When the functional film layer above the adjustment layer 11 is subsequently formed, a contamination from the material of the flexible substrate 10 can be prevented. For example, when the film above the adjustment layer 11 is etched in the etching chamber to form the corresponding functional film layer, the adjustment layer 11 may serve as an etching barrier layer to prevent the flexible substrate 10 from being etched, thus it can prevent the etching chamber from being contaminated by the material of the flexible substrate 10. As another example, the material of the flexible substrate 10 is prevented from contaminating the subsequently formed functional film layer.

The flexible display apparatus using the flexible display panel in the embodiments of the present disclosure can be applied to different products, for example, it can be applied to products such as mobile phones, tablet computers, e-books, etc., which are not listed one by one herein.

In the above embodiment, the protective layer 12 corresponds to the wires 13 in the bending area of the flexible display panel. Preferably, an orthographic projection of the protective layer 12 on the flexible substrate 10 coincides with an orthographic projection of the wires 13 on the flexible substrate 10, thereby further reducing the coverage area of the protective layer 12 under the wires 13. When the bending area is being bent, stress concentration is not easily formed in the protective layer 12, and the stress in the protective layer 12 is easily released, thereby further reducing the occurrence of cracks or even breaks in the wires 13 to prevent the conductive function of the wires 13 from being adversely affected.

Please continue to refer to FIG. 2 or FIG. 3, in the flexible display panel provided by the embodiment of the present disclosure, a passivation layer 14 may also be provided between the wires 13 and the planarization layer 15. When the bending area is bent, the stress that the passivation layer 14 bears is equal to the stress that the protection layer 12 bears. When the bending area is being bent, the passivation layer 14 and the protective layer 12 cooperate with each other to release the stress. At the same time, when the bending area is bent, the stress that the passivation layer 14 bears is equal to the stress that the protective layer 12 bears. The wires 13 are pulled by the passivation layer 14 and the protective layer 12, and the upper and lower sides of the wires 13 are evenly stressed, thereby further reducing the occurrence of cracks or even breaks in the wires 13 to prevent the conductive function of the wires 13 from being adversely affected.

In the above embodiment, when the bending area is bent, a stress that the passivation layer 14 bears is equal to the stress that the protective layer 12 bears. In this case, when the material quality of the passivation layer 14 and the protective layer 12 is equivalent, the thickness of the passivation layer 14 and the protective layer 12 may be set equal, so that when the bending area is bent, the stress that the passivation layer 14 bears is equal to the stress that the protective layer 12 bears; when the material quality of the passivation layer 14 differs greatly from the material quality of the protective layer 12, the thickness of the functional film layer needs to be determined according to the difference in material quality, so that when the bending region is bent, the stress that the passivation layer 14 bears is equal to the stress that the protective layer 12 bears. When there is a passivation layer 14 provided between the wires 13 and the planarization layer 15, the structure of the passivation layer 14 can be various. For example, please continue to refer to FIG. 2, the passivation layer 14 may cover the wires 13 and the adjustment layer 11 in the bending area. That is, after completing the deposition of the passivation film, the passivation film is directly used as the passivation layer 14, without further etching or other processes. In this way, the process steps of manufacturing the flexible display panel can be reduced, thereby increasing efficiency and lowering the cost.

Please continue to refer to FIG. 3, the passivation layer 14 is located on the wires 13 in the bending area, and the passivation layer 14 corresponds to the wires 13 in the bending area. That is, after completing the deposition of the passivation film, the passivation film is etched to form a passivation layer 14 located on the wires 13 in the bending area and corresponding to the wires 13 in the bending area. In this way, the passivation layer 14 does not cover sides of the wires 13 in the bending area, and thus the probability of stress being transmitted from sides of the wires 13 in the bending area to the wires 13 in the bending area can be reduced and the probability of stress conduction between adjacent wires 13 can be reduced, thereby reducing the occurrence of cracks or even breaks in the wires 13 to prevent the conductive function of the wires 13 from being adversely affected.

When the passivation layer 14 is located on the wires 13, and corresponds to the wires 13, and the material of the passivation layer 14 and that of the protective layer 12 are the same, or, the etching process for forming the passivation layer 14 and that for forming the protective layer 12 are the same, in the case of manufacturing a flexible display panel, a protective film may be deposited firstly, and then the wires 13 are formed on the protective film, then a passivation film is deposited, and then a mask is used to etch the passivation film and the protective film in sequence to form a passivation layer 14 and the protective layer 12 to reduce the process steps of manufacturing a flexible display panel, thereby increasing efficiency and lowering the cost.

In the above embodiment, the material selection of the passivation layer 14 can be performed according to actual needs, on the premise that the stress that the passivation layer 14 bears is equal to the stress that the protective layer 12 bears when the bending area is bent. For example, the material of the passivation layer 14 may be silicon oxide, silicon nitride, silicon oxynitride, organic material, and the like.

In the above embodiment, the material of the adjustment layer 11 may be a-Si. In the flexible display panel provided by the embodiments of the present disclosure, the thin film transistors in the display area may use low temperature polysilicon thin film transistors, which includes an active layer, a source, a drain and a gate, where the active layer is located on the flexible substrate; the active layer is P-type Si, made by a-Si doped. That is to say, the active layer is formed on the basis of the adjustment layer; the gate is located on the active layer; the source and the drain are arranged on both sides of the gate, and are formed by a-Si through ion implantation. In this way, if the material of the adjustment layer 11 is selected as a-Si, there is no need to form an additional adjustment layer 11, thereby reducing the process steps of manufacturing a flexible display panel, increasing efficiency and lowering the cost; in addition, when forming the active layer, it is sufficient to directly perform doping treatment on a-Si without etching, thus the process steps of manufacturing the flexible display panel can be further reduced, thereby increasing efficiency and lowering the cost.

In the above embodiment, the thickness of the adjustment layer 11 can be set according to actual needs. For example, the thickness of the adjustment layer 11 can be set to be less than or equal to 1000 Å, preferably less than or equal to 500 Å, so that stress is not easily concentrated.

In the above embodiment, the material of the protective layer 12 can be selected according to actual needs. For example, the material of the protective layer 12 can be selected from the group consisting of silicon oxide, silicon nitride, silicon oxynitride and organic material. In the embodiment of the present disclosure, the material of the protective layer 12 is preferably silicon oxide to prevent the hydrogen bond in the material of the protective film from adversely affecting the thin film transistor in the display area when the protective film is deposited.

In the above embodiment, the cooperation of the protective layer 12 and the adjustment layer 11 can reduce the occurrence of cracks or even breaks in the wires 13 to prevent the conductive function of the wires 13 from being adversely affected. The thickness of the protective layer 12 can be set to be small, for example, the thickness of the protective layer 12 may be set to be less than or equal to 1000 Å, preferably 500 Å to 1000 Å, to prevent the relatively thick protective layer 12 from causing stress concentration in the protective layer 12.

In order to verify the effectiveness of the above solution, in the embodiment of the present disclosure, a-Si is selected as the material of the adjustment layer 11, and 300 Å is selected as the thickness of the adjustment layer 11; silicon oxide is selected as the material of the protective layer 12, and 500 Å is selected as the thickness of the protective layer 12; and silicon nitride or silicon oxide is selected as the material of the passivation layer 14. In this case, the material quality of the passivation layer 14 and the protective layer 12 is equivalent, and the thickness of the passivation layer 14 and the protective layer 12 is set to be the same, that is, the thickness of the passivation layer 14 is selected to be 500 Å. It has been verified that selecting a-Si as the material of the adjustment layer 11 and selecting 300 Å as the thickness thereof, and selecting silicon oxide as the material of the protective layer 12, and selecting 500 Å as the thickness thereof, bring benefits to form an interface between the protective layer 12 and the adjustment layer 11 when forming the protective layer 12 on the adjustment layer 11. The formation of this interface can release the bending force when the bending area is bent, and can relieve the stress that the protective layer bears when the bending area is bent, and can effectively release the stress, thus the occurrence of cracks or even breaks in the wires 13 can be reduced to prevent the conductive function of the wires 13 from being adversely affected. In the case that silicon oxide is selected as the material of the protective layer 12 and 500 Å is selected as the thickness thereof, and silicon nitride or silicon oxide is selected as the material of the passivation layer 14 and 500 Å is selected as the thickness thereof, the material quality of the passivation layer 14 and the protective layer 12 is equivalent, and the thickness of the passivation layer 14 and the protective layer 12 is the same, therefore, when the bending area is bent, the stress that the passivation layer 14 bears is equal to the stress that the protection layer 12 bears, and the cooperation of the protection layer 12 and the passivation layer 14 can effectively release the stress. At the same time, when the bending area is bent, the stress that the passivation layer 14 bears is equal to the stress that the protective layer 12 bears. The wires 13 are pulled by the passivation layer 14 and the protective layer 12, and the upper and lower sides of the wires 13 are evenly stressed, thereby further reducing the occurrence of cracks or even breaks in the wires 13 to prevent the conductive function of the wires 13 from being adversely affected.

An embodiment of the present disclosure also provides a flexible display apparatus including the flexible display panel as described in the above embodiments. The flexible display apparatus can be used in mobile phones, tablet computers, e-books and other products.

The flexible display apparatus has the same advantages as the above-mentioned flexible display panel over the prior art, which will not be repeated herein.

Figure 4:
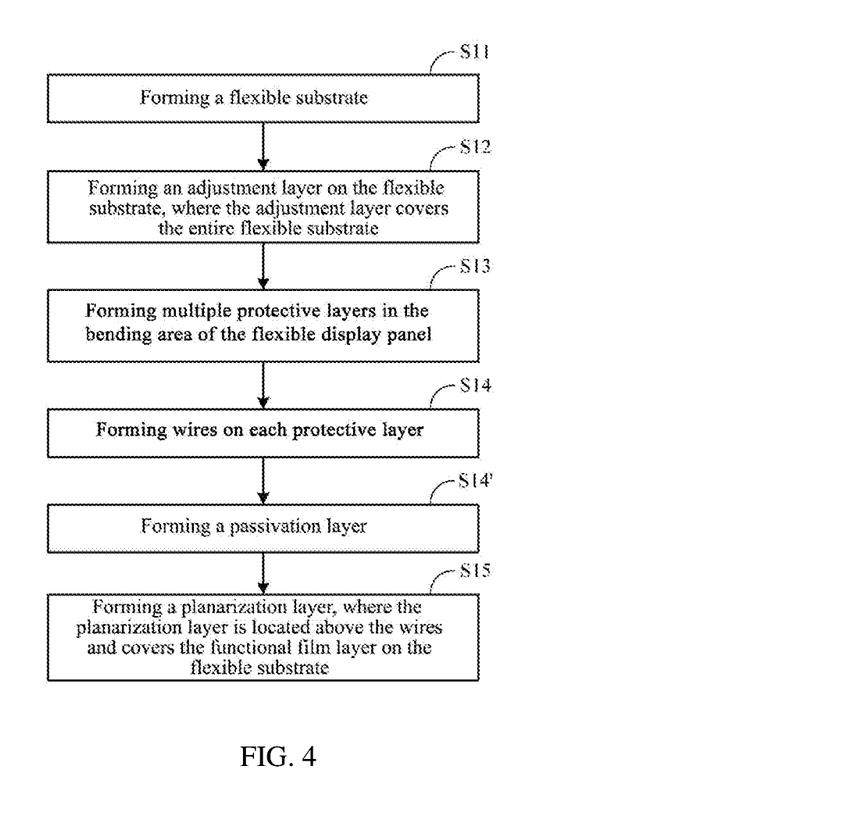
FIG. 4 is a flowchart of a method for manufacturing a flexible display panel provided by an embodiment of the present disclosure.

Referring to FIG. 4, an embodiment of the present disclosure also provides a method for manufacturing a flexible display panel, which is used to manufacture the flexible display panel described in the above embodiments. The method for manufacturing the flexible display panel includes:

Step S11: forming a flexible substrate 10. Specifically, before forming the flexible substrate 10, a rigid substrate is provided to carry the flexible substrate 10, and then the flexible substrate 10 is formed on the rigid substrate. The flexible substrate 10 may be a single-layer structure or a multilayer structure, and at least one layer of the flexible substrate 10 may be made from polyimide as selected.

Step S12: forming an adjustment layer 11 on the flexible substrate 10, where the adjustment layer 11 covers the entire flexible substrate 10. Specifically, an adjustment layer 11 covering the entire flexible substrate 10 may be formed on the flexible substrate 10 by means of magnetron sputtering, etc. The adjustment layer 11 may be an a-Si adjustment layer 11, and the thickness of the adjustment layer 11 is less than or equal to 1000 Å, preferably less than or equal to 500 Å.

Step S13: forming multiple protective layers 12 in the bending area of the flexible display panel.

Step S14: forming wires 13 on each protective layer 12. Specifically, the metal film is deposited firstly, and then the mask is used to etch the metal film through an etching process to form the wires 13. An orthographic projection of the protective layer 12 on the flexible substrate 10 coincides with an orthographic projection of the corresponding wires 13 in the bending area on the flexible substrate 10.

Step S15: forming a planarization layer 15, where the planarization layer 15 is located above the wires 13 and covers the functional film layer on the flexible substrate 10. Specifically, the planarization layer 15 is formed by vapor deposition, coating, etc., and the planarization layer 15 covers the functional film layer on the flexible substrate 10 to protect the functional film layer, and facilitate the formation of subsequent film layers simultaneously.

The embodiments in this specification are described in a progressive manner. The same or similar parts among various embodiments can be referred to each other. Each embodiment focuses on the differences from other embodiments. In particular, for the manufacturing method embodiment, since it is basically similar to the panel embodiment, the description is relatively simple. For related parts, please refer to the description of the panel embodiment.

The flexible display panel provided by the embodiment of the present disclosure may further include a passivation layer 14 provided between the protective layer 12 and the planarization layer 15. And please continue to refer to FIG. 4, after step S14 and before step S15, the method for manufacturing a flexible display panel further includes:

Step S14': forming a passivation layer 14.

Figure 5:
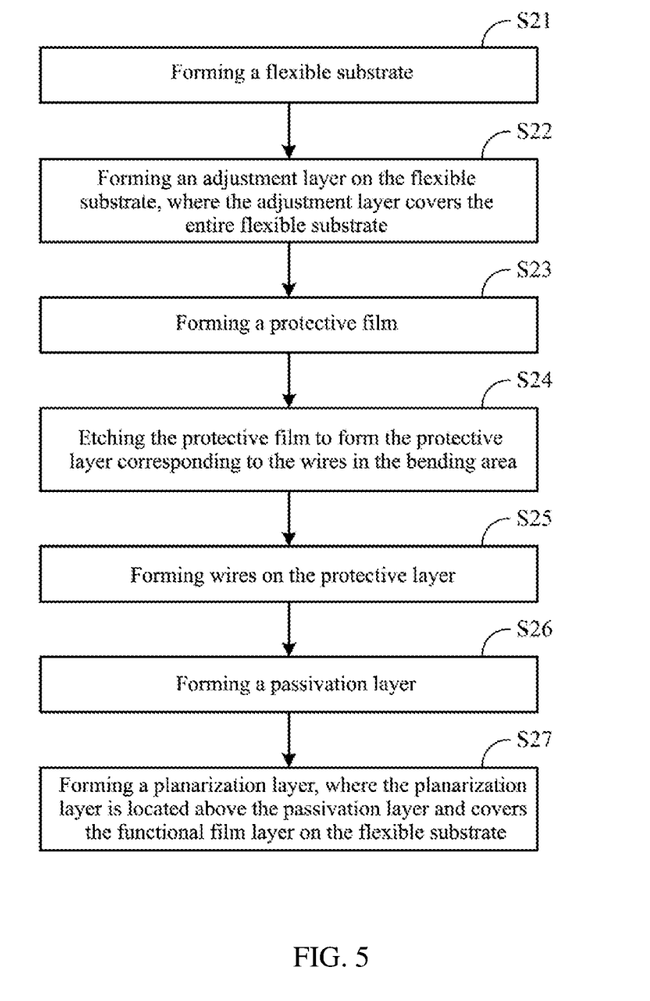
FIG. 5 is a flowchart of another method for manufacturing a flexible display panel provided by an embodiment of the present disclosure, in which a way for forming a protection layer is different from that of the method shown in FIG. 4.

The structure of the passivation layer 14 can be in various forms. For example, please continue to refer to FIG. 2. The passivation layer 14 may cover the wires 13 and the adjustment layer 11. In other words, after completing the deposition of the passivation film, the passivation film is directly used as the passivation layer 14, without further etching or other processes. The above step S13, step S14 and step S14' may adopt the following solution: forming a protective film, and etching the protective film to form the protective layer 12 corresponding to the wires 13 in the bending area; forming wires 13 on the protective layer 12; forming a passivation layer 14, where the passivation layer 14 covers the wires 13 in the bending area and the adjustment layer 11. In this case, referring to FIG. 5, the method for manufacturing a flexible display panel may include:

Step S21: forming a flexible substrate 10.

Step S22: forming an adjustment layer 11 on the flexible substrate 10, where the adjustment layer 11 covers the entire flexible substrate 10.

Step S23: forming a protective film. Specifically, the protective film may be formed on the adjustment layer 11 by vapor deposition and the like. Silicon oxide is selected as the material of the protective film to prevent the hydrogen bond in the material of the protective film from adversely affecting the thin film transistor in the display area.

Step S24: etching the protective film to form the protective layer 12 corresponding to the wires 13 in the bending area; specifically, a mask is used to etch the protective film through an etching process to form the protective layer 12 corresponding to the wires 13 in the bending area.

Step S25: forming wires 13 on the protective layer 12.

Step S26: forming a passivation layer 14. Specifically, the passivation layer 14 is formed by vapor deposition and the like, where the passivation layer 14 covers the wires 13 in the bending area and the adjustment layer 11.

Step S27: forming a planarization layer 15, where the planarization layer 15 is located above the passivation layer 14 and covers the functional film layer on the flexible substrate 10.

Figure 6:
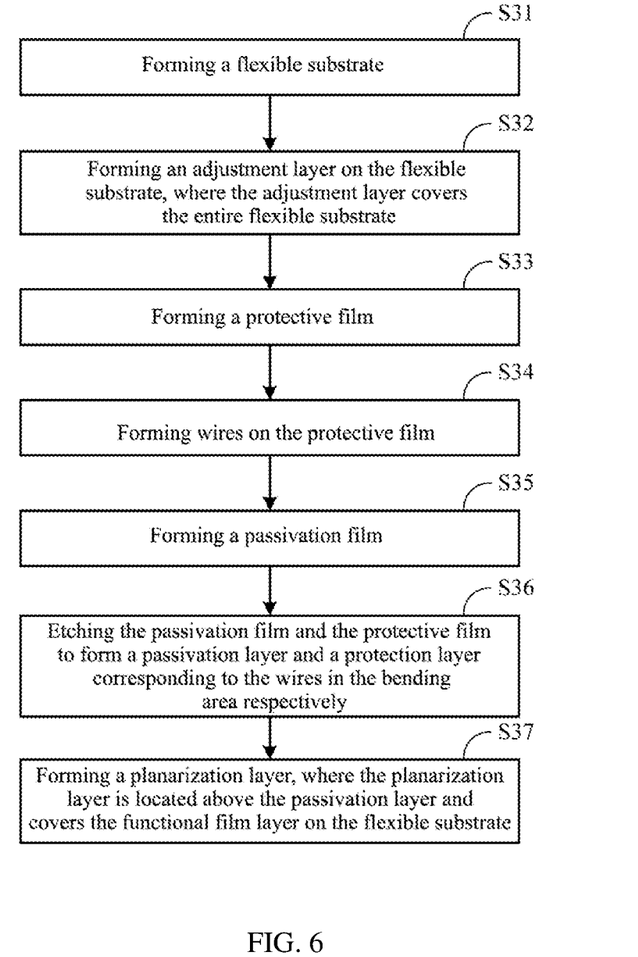
FIG. 6 is a flowchart of yet another method for manufacturing a flexible display panel provided by an embodiment of the present disclosure, in which a way for forming a passivation layer is different from that of the method shown in FIG. 4.

Please continue to refer to FIG. 3, the passivation layer 14 is located on the wires 13, and the passivation layer 14 corresponds to the wires 13 in the bending area. That is, after completing the deposition of the passivation film, the passivation film is etched to form a passivation layer 14 on the wires 13 in the bending area and corresponding to the wires 13 in the bending area. The above steps S13, S14 and S14' can be adopted as follows: forming a protective film; forming wires 13 on the protective film; forming a passivation film, and etching the passivation film and the protective film to form a passivation layer 14 and a protection layer corresponding to the wires 13 in the bending area respectively. In this case, referring to FIG. 6, the method for manufacturing a flexible display panel may include:

Step S31: forming a flexible substrate 10.

Step S32: forming an adjustment layer 11 on the flexible substrate 10, where the adjustment layer 11 covers the entire flexible substrate 10.

Step S33: forming a protective film. Specifically, the protective film may be formed on the adjustment layer 11 by vapor deposition and the like. Silicon oxide is selected as the material of the protective film to prevent the hydrogen bond in the material of the protective film from adversely affecting the thin film transistor in the display area.

Step S34: forming wires 13 on the protective film.

Step S35: forming a passivation film.

Step S36: etching the passivation film and the protective film to form a passivation layer 14 and a protection layer corresponding to the wires 13 in the bending area respectively.

Step S37: forming a planarization layer 15, where the planarization layer 15 is located above the passivation layer 14 and covers the functional film layer on the flexible substrate 10.

In this way, the step of etching the protective film to form the protective layer 12 and the step of etching the passivation film to form the passivation layer 14 can be achieved by performing etching process once, so that the process steps of manufacturing the flexible display panel are reduced, thereby increasing efficiency and lowering the cost.

Figure 7:
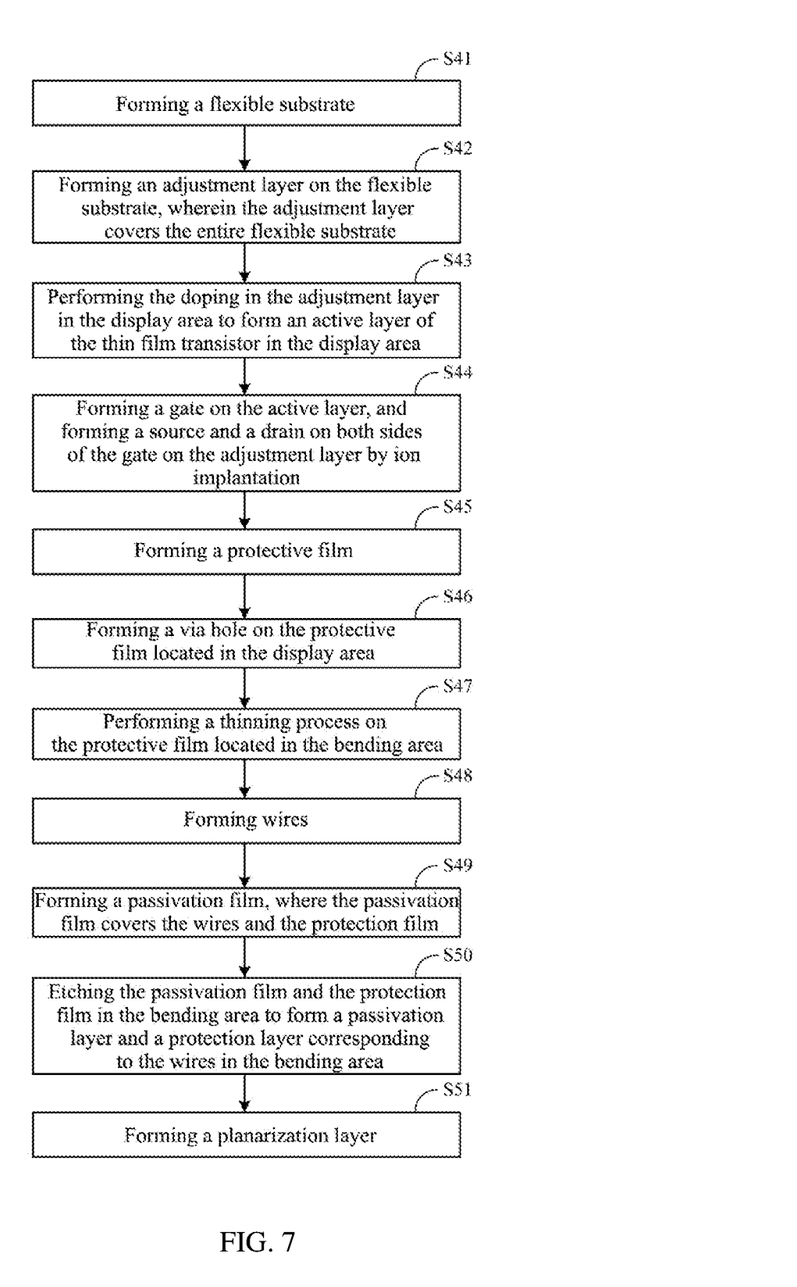
FIG. 7 is a flowchart of still another method for manufacturing a flexible display panel provided by an embodiment of the present disclosure, in which additional steps are introduced on the basis of the method shown in FIG. 4.

In the embodiment of the present disclosure, the flexible display panel includes a display area and a bending area. The thin film transistor in the display area may adopt the structure shown in FIG. 4, and the structure in the bending area uses the structure shown in FIG. 3. Please refer to FIG. 7, the method for manufacturing a flexible display panel may specifically include:

Step S41: forming a flexible substrate 10.

Step S42: forming an adjustment layer 11 on the flexible substrate 10, where the adjustment layer 11 covers the entire flexible substrate 10.

Step S43: performing the doping in the adjustment layer 11 in the display area to form an active layer of the thin film transistor in the display area.

Step S44: forming a gate on the active layer, and forming a source and a drain on both sides of the gate on the adjustment layer 11 by ion implantation.

Step S45: forming a protective film.

Step S46: forming a via hole on the protective film located in the display area, so as to achieve the connection between the electrode that need to be connected to the wires 13 under the protective film and the wires 13, for example, the via hole may correspond to the source to achieve the connection of the source and the wires 13.

Step S47: performing a thinning process on the protective film located in the bending area, so that the thickness of the protective film in the bending area is less than or equal to 1000 Å, preferably 500 Å~1000 Å.

Step S48: forming wires 13. In the display area, the wires 13 are connected to an electrode under the protective film such as the source through the via hole in the protective film; and the wires 13 are located on the protective layer 12 in the bending area.

Step S49: forming a passivation film, where the passivation film covers the wires 13 and the protection film.

Step S50: etching the passivation film and the protection film in the bending area to form a passivation layer 14 and a protection layer corresponding to the wires 13 in the bending area; and orthographic projections of the wires 13 in the bending area, the protective layer 12 and the passivation layer 14 on the flexible substrate 10 coincide with each other.

Step S51: forming a planarization layer 15.

In the method for manufacturing a flexible display panel provided by the embodiment of the present disclosure, compared with the prior art in which multiple insulating layers need to be additionally formed in the bending area, all of the adjustment layer 11, the protective layer 12 and the passivation layer 14 in the bending area can be shared with the display area without additional formation. Therefore, the process steps for manufacturing the flexible display panel are reduced, thereby increasing efficiency and lowering the cost.

The above embodiments are only used to illustrate the technical solutions of the present disclosure, without limitation to the above embodiments. Although the present disclosure has been described in detail with reference to the foregoing embodiments, those skilled in the art should understand: modifications to the technical solutions described in the foregoing embodiments, or equivalent substitutions of some or all of the technical features therein can still be made. However, these modifications or substitutions do not deviate from the scope of the technical solutions of the embodiments of the present disclosure.

What is claimed is:

1. A flexible display panel, comprising a display area and a bending area located around the display area, wherein the bending area comprises:

a flexible substrate;

an adjustment layer, covering the entire flexible substrate;

a protective layer, located on the adjustment layer;

a plurality of wires, located on the protective layer; and a planarization layer, located above the plurality of wires and covering a functional film layer on the flexible substrate;

wherein the protective layer corresponds to the plurality of wires in the bending area, and an orthographic projection of the plurality of wires in the bending area on the flexible substrate falls into an orthographic projection of the protective layer on the flexible substrate; and when the bending area is bent, a bending stress is released through an interface between the adjustment layer and the protective layer, to relieve a protective layer stress that the protective layer bears when the bending area is bent.

2. The flexible display panel according to claim 1, wherein the orthographic projection of the protective layer on the flexible substrate coincides with the orthographic projection of the plurality of wires in the bending area on the flexible substrate.

3. The flexible display panel according to claim 1, wherein a passivation layer is provided between the wires and the planarization layer, and when the bending area is bent, a passivation layer stress that the passivation layer bears is equal to the protective layer stress that the protective layer bears.

4. The flexible display panel according to claim 3, wherein the passivation layer is selected from a group consisting of a silicon oxide passivation layer, a silicon nitride passivation layer, a silicon oxynitride passivation layer and an organic material passivation layer.

5. The flexible display panel according to claim 3, wherein the passivation layer covers the plurality of wires in the bending area and the adjustment layer.

6. The flexible display panel according to claim 3, wherein the passivation layer is located on the plurality of wires in the bending area and corresponds to the plurality of wires in the bending area, and an orthographic projection of the passivation layer on the flexible substrate coincides with the orthographic projection of the plurality of wires in the bending area on the flexible substrate.

7. The flexible display panel according to claim 1, wherein the adjustment layer is an a-Si layer.

8. The flexible display panel of claim 1, wherein a thickness of the adjustment layer is less than or equal to 1000 Å.

9. The flexible display panel of claim 8, wherein the thickness of the adjustment layer is less than or equal to 500 Å.

10. The flexible display panel according to claim 1, wherein the protective layer is a silicon oxide protective layer.

11. The flexible display panel according to claim 1, wherein a thickness of the protective layer is less than or equal to 1000 Å.

12. The flexible display panel according to claim 11, wherein the thickness of the protective layer ranges from 500 Å to 1000 Å.

13. The flexible display panel according to claim 1, wherein there is no integral protective layer between adjacent wires in the bending area.

14. A flexible display apparatus comprising the flexible display panel according to claim 1.

15. A method for manufacturing a flexible display panel, comprising:
    forming a flexible substrate;
    forming an adjustment layer on the flexible substrate, wherein the adjustment layer covers the entire flexible substrate;
    forming a protective layer on the adjustment layer;
    forming wires on the protective layer; and
    forming a planarization layer above the wires, wherein the planarization layer is located above wires in a bending area and covers a functional film layer on the flexible substrate;
    wherein the protective layer corresponds to the wires in the bending area of the flexible display panel, and an orthographic projection of the wires in the bending area on the flexible substrate falls into an orthographic projection of the protective layer on the flexible substrate;
    and, before the forming of a planarization layer above the wires, further comprising:
    forming a passivation layer, wherein the passivation layer is located between the wires and the planarization layer.

16. The method for manufacturing a flexible display panel according to claim 15, wherein the protective layer, the wires and the passivation layer are formed by following steps:
    forming the protective film;
    etching the protective film to form the protective layer;
    forming the wires on the protective layer, wherein an orthographic projection of the wires in the bending area on the flexible substrate coincides with the orthographic projection of the protective layer on the flexible substrate; and
    forming the passivation layer, wherein the passivation layer covers the wires in the bending area and the adjustment layer.

17. The method for manufacturing a flexible display panel according to claim 15, further comprising:
    forming a protective film;
    forming the wires on the protective film;
    forming a passivation film, wherein the passivation film covers the wires in the bending area and the protective film; and
    etching the passivation film and the protective film to form the protective layer corresponding to the wires in the bending area and the passivation layer corresponding to the wires in the bending area, wherein the orthographic projections of the wires in the bending area, the protective layer and the passivation layer on the flexible substrate coincide with each other,
    wherein there is no integral protective layer between adjacent wires in the bending area.

18. A flexible display panel, comprising:
    a flexible substrate;
    an adjustment layer, covering the entire flexible substrate;
    a protective layer, located on the adjustment layer;
    a plurality of wires, located on the protective layer; and
    a planarization layer, located on the wires and covering a functional film layer on the flexible substrate;
    wherein the flexible display panel comprises a display area and a bending area located outside the display area, the protective layer corresponds to the wires in the bending area, and an orthographic projection of the wires in the bending area on the flexible substrate falls into an orthographic projection of the protective layer on the flexible substrate; and when the bending area is bent, a bending stress is released through an interface between the adjustment layer and the protective layer, to relieve a protective layer stress that the protective layer bears when the bending area is bent.

19. The flexible display panel according to claim 18, wherein a thickness of the adjustment layer is less than or equal to 1000 Å.

20. The flexible display panel according to claim 18, wherein the orthographic projection of the protective layer on the flexible substrate coincides with the orthographic projection of the wires in the bending area on the flexible substrate.

* * * * *